(12) United States Patent
Yagi et al.

(10) Patent No.: US 7,928,566 B2
(45) Date of Patent: Apr. 19, 2011

(54) CONDUCTIVE BUMP, METHOD FOR MANUFACTURING THE CONDUCTIVE BUMP, SEMICONDUCTOR DEVICE AND METHOD FOR MANUFACTURING THE SEMICONDUCTOR DEVICE

(75) Inventors: Yoshihiko Yagi, Hyogo (JP); Daisuke Sakurai, Osaka (JP)

(73) Assignee: Panasonic Corporation, Osaka (JP)

( * ) Notice: Subject to any disclaimer, the term of this patent is extended or adjusted under 35 U.S.C. 154(b) by 84 days.

(21) Appl. No.: 12/514,649

(22) PCT Filed: Nov. 20, 2007

(86) PCT No.: PCT/JP2007/072423
§ 371 (c)(1),
(2), (4) Date: May 13, 2009

(87) PCT Pub. No.: WO2008/078478
PCT Pub. Date: Jul. 3, 2008

(65) Prior Publication Data
US 2010/0029044 A1    Feb. 4, 2010

(30) Foreign Application Priority Data
Dec. 27, 2006  (JP) .................................. 2006-351242

(51) Int. Cl.
*H01L 23/48* (2006.01)
(52) U.S. Cl. .. 257/737; 257/738; 257/746; 257/E23.018
(58) Field of Classification Search .................. 257/737, 257/738, 746, E23.018; 438/613, 614
See application file for complete search history.

(56) References Cited

U.S. PATENT DOCUMENTS

| 6,225,205 | B1 | 5/2001 | Kinoshita | |
|---|---|---|---|---|
| 6,297,559 | B1 * | 10/2001 | Call et al. | 257/778 |
| 6,492,737 | B1 * | 12/2002 | Imasu et al. | 257/778 |
| 2009/0315178 | A1 * | 12/2009 | Sakurai et al. | 257/737 |
| 2009/0321926 | A1 * | 12/2009 | Nakamura et al. | 257/737 |
| 2010/0052163 | A1 * | 3/2010 | Ouchi | 257/737 |
| 2010/0213609 | A1 * | 8/2010 | Kondou et al. | 257/737 |
| 2010/0276803 | A1 * | 11/2010 | Higuchi et al. | 257/738 |

FOREIGN PATENT DOCUMENTS

| JP | 1-157796 | 6/1989 |
|---|---|---|
| JP | 2-280334 | 11/1990 |
| JP | 6-151438 | 5/1994 |
| JP | 7-74459 | 3/1995 |
| JP | 11-274199 | 10/1999 |
| JP | 11-274209 | 10/1999 |
| JP | 2000-94179 | 4/2000 |

OTHER PUBLICATIONS

International Search Report issued Feb. 5, 2008 in the International (PCT) Application PCT/JP2007/072423 of which the present application is the U.S. National Stage.
Yokoh, K. et al., *Super Juffit method. Electronic Packaging Technology*. vol. 16, No. 9 (Sep. 2000). pp. 38-45 (with English translation).

* cited by examiner

*Primary Examiner* — George Fourson
(74) *Attorney, Agent, or Firm* — Wenderoth, Lind & Ponack, L.L.P.

(57) ABSTRACT

Conductive bump (17) formed on a surface of electrode terminal (11) of an electronic component. Conductive bump (17) is composed of at least a plurality of cured resin materials having different conductive filler densities. Thus, a short circuit and a connection failure due to crush of conductive bump (17) at the time of mounting can be prevented.

15 Claims, 7 Drawing Sheets

CONDUCTIVE BUMP, METHOD FOR MANUFACTURING THE CONDUCTIVE BUMP, SEMICONDUCTOR DEVICE AND METHOD FOR MANUFACTURING THE SEMICONDUCTOR DEVICE

TECHNICAL FIELD

The present invention relates to a conductive bump formed on an electrode terminal of a semiconductor element or an electrode terminal of a circuit board. More particularly, the present invention relates to a semiconductor device in which semiconductor elements having narrow-pitched electrode terminals are reliably mounted on electrode terminals of a circuit board.

BACKGROUND ART

Recently, in mobile electronic devices such as portable telephones, notebook-sized personal computers, PDAs and digital video cameras, which have been rapidly widespread, technology development for realizing small, thin and light devices has been rapidly advanced.

One principle electronic component for supporting this technology development is a semiconductor element. As the density of semiconductor elements is increased, the pitches and areas of electrode terminals have been reduced. Accordingly, strict requirements have been made with respect to a conductive bump used in flip-chip mounting a semiconductor element on a mounting board.

In this case, as the pitches of electrode terminals are narrowed, a short circuit between neighboring connection terminals on a mounting board occurs and a connection failure easily occurs between a conductive bump and an electrode terminal by stress that may be generated due to a difference in the thermal expansion coefficient between the semiconductor element and the mounting board.

In particular, the above-mentioned mobile electronic devices such as portable telephones may undergo shock when they are dropped. Therefore, when connection reliability between electrode terminals is insufficient, failure of the mobile electronic device may occur.

Furthermore, as the wiring rule of a semiconductor element becomes finer, the dielectric constant of an insulating layer formed on a semiconductor element is reduced and the insulating layer becomes porous. Therefore, when an Au bump and the like is mounted by a conventional flip-chip mounting, stress applied to the insulating layer below the Au bump may cause damage such as crack in the insulating layer.

On the other hand, in an area bump method for forming a conductive bump by using an entire surface on which a circuit is formed of a semiconductor element in order to avoid narrowing of pitches, high flatness of a mounting board is required in the entire mount area. In general, in the area bump method, firstly, a plurality of electrode terminals are formed on the semiconductor element and then a bump of solder, Au, or the like, is formed on the electrode terminals.

Next, bumps on the semiconductor element are allowed to face connection terminals formed on a circuit board, and the bumps on the electrode terminals are electrically bonded to the corresponding connection terminals, respectively. Furthermore, in order to improve electrical and mechanical bonding between the semiconductor element and the circuit board, a resin material is filled (under fill) between the semiconductor element and the circuit board.

However, in order to mount a next generation LSI whose number of electrode terminals is more than 5000 on a circuit board, it is necessary to form bumps corresponding to a narrow pitch of not more than 100 μm. However, it is difficult for current solder-bump formation technologies to do it.

Furthermore, it is necessary to form a large number of bumps corresponding to the number of electrode terminals. Therefore, in order to reduce the cost, high productivity is also required by reducing a mounting tact time per semiconductor element.

Conventionally, as the bump formation technology, a plating method, a screen printing method and the like have been used. The plating method is suitable for narrowing pitches but the step may become complicated, thus affecting productivity.

Furthermore, the screen printing method is excellent in productivity but has difficulty in narrowing pitches because the method uses a mask.

Under such circumstances, recently, technologies of selectively forming solder bumps on connection terminals of an LSI element or electrode terminals of a circuit board have been proposed. These technologies are not only suitable for forming fine bumps but also excellent in forming bumps at one time. Therefore, these technologies are receiving attentions as technologies suitable for mounting on boards of next generation LSI.

In the above-mentioned technology, firstly, a solder paste, which is made of a mixture of solder powder and flux and on the surface of which an oxide film is formed, is coated on the entire surface of the circuit board on which connection terminals are formed. Then, the circuit board is heated in this state, thereby melting the solder powder. As a result, a solder layer is selectively formed on the connection terminals without causing short circuits between the neighboring connection terminals (see, for example, patent document 1).

Another technology is carried out by coating a paste composition containing organic acid lead salt and metal tin as principle components on the entire surface of a circuit board on which connection terminals are formed, heating the circuit board to cause a substitution reaction of Pb and Sn, and allowing a Pb/Sn alloy to precipitate selectively on the connection terminal of the circuit board (see, for example, patent document 2 or non-patent document 1).

In still another technology, a circuit board on which an electrode is formed on the surface thereof is dipped in chemicals so as to form an adhesive film only on the surface of a connection terminal, and then solder powder is attached to the adhesive film, followed by heating and melting. Thus, a bump is selectively formed on the connection terminal (see, for example, patent document 3).

However, these technologies show a method for forming bumps on electrode terminals of a semiconductor element or connection terminals of a circuit board. In a general flip-chip mounting, after bumps are formed, a semiconductor element is mounted on a circuit board. A step of bonding between the connection terminal and the electrode terminal via a bump by a solder reflow and a step of injecting an under fill material between the circuit board and the semiconductor element to fix the semiconductor to the circuit board are needed. Therefore, production cost may be increased.

In order to solve such problems, a method for printing a conductive paste on the surface of a semiconductor element on which an electrode is formed via through holes of a printing screen, thereby forming a bump electrode at one time at a low cost is generally used (see, for example, patent document 4).

However, the conductive bump described in patent document 4 has the below-mentioned problems as described with reference to cross-sectional views shown in FIGS. 7A to 7E showing a method for forming a conductive bump by using a conductive paste.

Firstly, as shown in FIG. 7A, on the upper surface of semiconductor element 102 provided with a plurality of electrode terminals 101, printing screen 104 having openings 103 in positions corresponding to the plurality of electrode terminals 101 is disposed. Then, conductive paste 105 is placed on the upper surface of printing screen 104 and is pressed by squeegee 106. Thus, conductive paste 105 is printed on and filled in the surface of electrode terminal 101 from opening 103.

Next, as shown in FIG. 7B, by removing printing screen 104, conductive bump 105a is formed on electrode terminal 101 in a state in which a viscosity at the printing time is low. At this time, as shown in FIG. 7C, conductive bump 105a on electrode terminal 101 causes a dripping phenomenon around electrode terminal 101 over time due to a low viscosity, thus limiting the narrowing of pitches.

Next, as shown in FIG. 7D, semiconductor element 102 is reversed, positioned to electrode terminals 108 provided on the surface of circuit board 107, and flip-chip mounted thereon. At this time, as shown in FIG. 7E, in the case where semiconductor element 102 and circuit board 107 are tilted at the time of mounting, a non-uniform pressing power difference may occur so as to cause crush of the conductive bump. It is not possible to suppress the generation of non-uniform connection resistance due to short circuit 109 between neighboring electrode terminals 101 or connection failure portion 110 caused by the crush of the conductive bump.

[Patent document 1] Japanese Patent Application Unexamined Publication No. 2000-94179
[Patent document 2] Japanese Patent Application Unexamined Publication No. H1-157796
[Patent document 3] Japanese Patent Application Unexamined Publication No. H7-74459
[Patent document 4] Japanese Patent Application Unexamined Publication No. H11-274209
[Non-patent document 1] Electronics Packaging Technology, September 2000, pp 38-45

SUMMARY OF THE INVENTION

A conductive bump of the present invention is a conductive bump formed on a surface of an electrode terminal of an electronic component. The conductive bump includes at least a plurality of cured resin materials having different conductive filler densities.

Thus, it is possible to maintain fine shape of the bump when a print mask is separated. Furthermore, when electronic components are mounted, an interval between the electronic components can be maintained constant by cured resin materials having different conductive filler densities. Thus, crush of the conductive bump, a short circuit and a connection failure between electrode terminals, and the like, can be suppressed effectively.

Furthermore, a method for forming a conductive bump of the present invention includes: positioning an opening of a print mask to an electrode terminal of an electronic component, and coating a conductive paste on the electrode terminal via the opening; removing the print mask, and then irradiating a part of a conductive paste on the electrode terminal with ultraviolet light or visible light via an exposure mask, so that a part of the conductive paste is cured so as to form a first cured portion; and heating the electronic component so as to a second cured portion in a portion other than the first cured portion.

A method for forming a conductive bump of the present invention includes: positioning an opening of a print mask to an electrode terminal of an electronic component, and printing a conductive paste on the electrode terminal via the opening; disposing an exposure mask on an upper surface of the print mask, and irradiating a part of the printed conductive paste with ultraviolet light or visible light via a liquid crystal mask, so that a part of the conductive paste is cured so as to form a first cured portion; heating the electronic component so as to form a second cured portion in a portion other than the first cured portion, and removing the exposure mask and the print mask.

Thus, it is possible to easily form a conductive bump that is excellent in mechanical and electrical connection stability at narrow pitches.

Furthermore, a semiconductor device of the present invention has a configuration in which an electrode terminal of a circuit board and an electrode terminal of a semiconductor element are electrically connected to each other by using the above-mentioned conductive bump. Thus, it is possible to realize a semiconductor device having a high reliability in the connection strength and the electrical connection.

Furthermore, a method for manufacturing a semiconductor device includes: cutting a semiconductor wafer on which a conductive bump is formed by the method for forming a conductive bump into individual semiconductor elements; reversing the semiconductor element, positioning and mounting the conductive bump on an electrode terminal of a circuit board; pressurizing and heating the semiconductor element and the circuit board, thereby curing at least a second cured portion of the conductive bump to bond the semiconductor element and the circuit board to each other; and filling a sealing resin into a gap between the semiconductor element and the circuit board and curing thereof.

Thus, it is possible to manufacture a semiconductor device that is excellent in mechanical and electrical connection stability at a high mounting density.

Figure 1A:
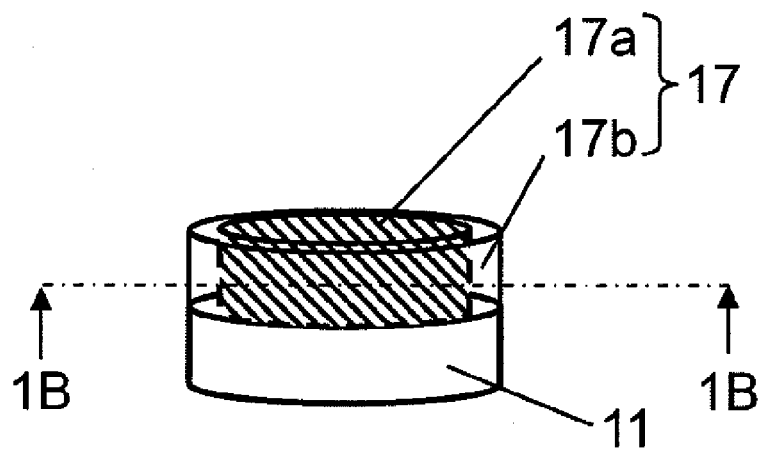
FIG. 1A is a perspective view conceptually illustrating a structure of a conductive bump in accordance with a first exemplary embodiment of the present invention.

REFERENCE MARKS IN THE DRAWINGS 11, 31, 41, 51, 61 electrode terminal
12, 32, 42 semiconductor wafer (electronic component)
13, 43 opening
14, 44 print mask
15, 45 conductive paste
16, 46 squeegee
17, 37, 47, 57 conductive bump
17a, 37a, 47a, 57a first cured portion
17b, 37b, 47b, 57b second cured portion
17c, 47c pre-conductive bump
18, 48 liquid crystal mask (exposure mask)
19, 49 light transmission portion
52 semiconductor element
60 circuit board
62 sealing resin

DETAILED DESCRIPTION OF THE PREFERRED EMBODIMENTS

Hereinafter, exemplary embodiments of the present invention are described with reference to drawings. The same reference numerals are given to the same configurations in each drawing.

First Exemplary Embodiment

Figure 1B:
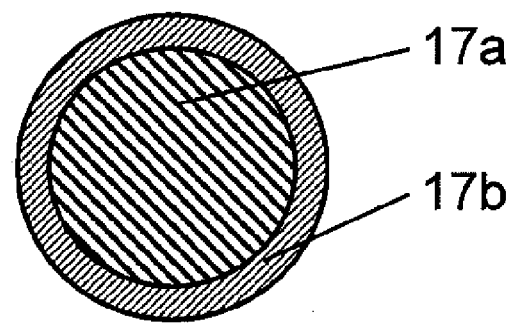
FIG. 1B is a cross-sectional view taken on line 1B-1B of FIG. 1A.

FIG. 1A is a perspective view conceptually illustrating a structure of a conductive bump in accordance with a first exemplary embodiment of the present invention, and FIG. 1B is a cross-sectional view taken on line 1B-1B of FIG. 1A. In FIGS. 1A and 1B, an electronic component on which a conductive bump is formed is not shown.

As shown in FIGS. 1A and 1B, conductive bump 17 formed on electrode terminal 11 of an electronic component (not shown) including, for example, a semiconductor element, a circuit board, and the like, is composed of, for example, first cured portion 17a and second cured portion 17b. First cured portion 17a is formed in the center portion of conductive bump 17 and cured by a photo-curing method and a thermal curing method. Second cured portion 17b is formed so as to surround first cured portion 17a on the outer periphery of electrode terminal 11 and is semi-cured in a prepreg state by a thermal curing method. Conductive bump 17 composed of first cured portion 17a and second cured portion 17b is formed of a cured resin material including conductive filler such as Ag particle. Therefore, when bonding to another circuit board is carried out via a conductive bump and curing is carried out, the conductive filler density of a cured resin material constituting first cured portion 17a is smaller than the conductive filler density of the cured resin material constituting second cured portion 17b. For example, the conductive filler density of first cured portion 17a is from 10% to 50%, and the conductive filler density of second cured portion 17b is from 50% to 90%. Note here that the above-mentioned numeric values represent not strictly densities but values calculated from the occupation rate of the conductive filler per unit area in the cross section of the conductive bump.

This is because first cured portion 17a is cured by at least two stages of curing, that is, photo-curing and thermal curing, and second cured portion 17b is cured by only thermal curing. In other words, since a resin component of the cured resin material of first cured portion 17a is cured by photo-curing before thermal curing, components volatizing at the time of thermal curing are reduced. Therefore, in the resin component of the cured resin material of second cured portion 17b, an amount of components volatizing at the time of thermal curing is increased. Consequently, the conductive filler density of second cured portion 17b is relatively larger than that of first cured portion 17a.

Herein, it is preferable that the cured resin material includes a multifunctional monomer having a plurality of photopolymerizable groups and a monofunctional monomer having only one photopolymerizable group.

As the multifunctional monomer having a plurality of photopolymerizable groups, for example, a compound having not less than two polymerizable functional groups such as a carbon—carbon double bond in one molecule is used. The number of polymerizable functional groups contained in the multifunctional monomer is preferably in the range from three to ten, but it is not particularly limited to the above-mentioned range. When the number of the polymerizable functional groups is less than three, a curing property tends to reduce. When the number of the functional groups is more than 10, the size of a molecule tends to be large, thus increasing a viscosity.

Specific examples of the multifunctional monomer having a plurality of photopolymerizable groups may include, for example, allylated cyclohexyl diacrylate, 1,4-butanediol diacrylate, 1,3 butylene glycol diacrylate, 1,6-hexanediol diacrylate, ethylene glycol diacrylate, diethylene glycol diacrylate, triethylene glycol diacrylate, polyethylene glycol diacrylate, pentaerythritol triacrylate, pentaerythritol tetracrylate, dipentaerythritol pentaacrylate, dipentaerythritol hexaacrylate, dipentaerythritol monohydroxy pentaacrylate, ditrimethylolpropane tetraacrylate, glycerol diacrylate, methoxy cyclohexyl diacrylate, neopentyl glycol diacrylate, propylene glycol diacrylate, polypropylene glycol diacrylate, triglycerol diacrylate, trimethylol propanetriacrylate, bisphenol A diacrylate, bisphenol A-ethylene oxide adduct diacrylate, bisphenol A-propylene oxide adduct diacrylate, and the like. In addition, compounds in which a part of or the all of the acryl groups included in the above compounds are substituted with, for example, a methacryl group can be used. Note here that a photo-reducing coloring matter and a photo polymerization initiator such as reducing agent may be added if necessary.

Furthermore, as the conductive filler, in addition to Ag, fine particles of metal such as Au, Pt, Ni, Cu, Pd, Mo and W, having an average particle diameter of about 0.1 µm-10 µm, are used. These fine metal particles may be used solely or may be used as a mixture containing two or more kinds. Furthermore, an alloy powder made of an alloy containing the above-mentioned element can be used as the conductive filler. It is suitable to use a metal material having a relatively low melting point and a low specific resistance value as the conductive particles for the purpose of forming a low-resistant conductor by firing at a low temperature. As an example of such a metal material, for example, Au, Ag, and Cu are preferable. Note here that among them, Ag is the most suitable. This is because Au is extremely expensive and Cu is easily oxidized, and therefore, firing cannot be carried out in the air. The shape of the conductive filler may include various shapes such as a bulk shape, a scale shape, a microcrystal shape, a spherical shape, a granular shape, and a flake shape, or may be indefinite in shape. Among them, the shape of the conductive particle is preferably a spherical or granular shape. This is because light transmittance is excellent at the time of exposure and the efficiency of light exposure is excellent.

According to the above-mentioned configuration, the first cured portion can prevent the conductive bump from dripping, and mounting of other electronic components at a low pressure and displacement are prevented by the semi-cured second cured portion. Thus, a conductive bump corresponding to narrow pitches and being excellent in the connection reliability can be formed.

Hereinafter, a method for forming a conductive bump in accordance with this exemplary embodiment is described with reference to FIGS. 2A to 2E. FIGS. 2A to 2E are cross-sectional views illustrating a method for forming a conductive bump in accordance with the first exemplary embodiment of the present invention. An example in which a semiconductor wafer having a large number of semiconductor elements thereon is used as an electronic component to be provided with a conductive bump is described. Furthermore, an example in which a liquid crystal mask is used as an exposure mask is described. However, a metal mask may be used. A liquid crystal mask has a great effect that the shape of a light transmission portion can be electrically changed arbitrarily.

Figure 2A:
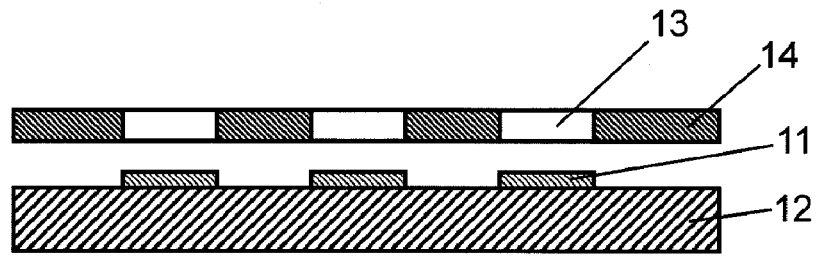
FIG. 2A is a cross-sectional view illustrating a method for forming a conductive bump in accordance with the first exemplary embodiment of the present invention.

Firstly, as shown in FIG. 2A, above the upper surface of semiconductor wafer 12 having a plurality of semiconductor elements on which a plurality of electrode terminals 11 are formed, print mask 14 having openings 13 for forming conductive bumps corresponding to the positions of electrode terminals 11 is disposed.

Figure 2B:
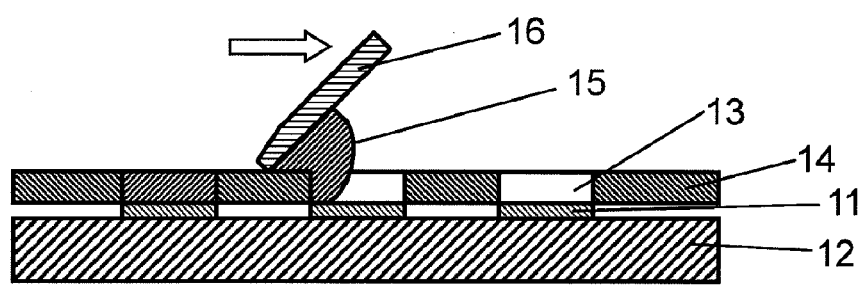
FIG. 2B is a cross-sectional view illustrating a method for forming a conductive bump in accordance with the first exemplary embodiment of the present invention.

Next, as shown in FIG. 2B, conductive paste 15 mixing, for example, 60 parts by weight to 90 parts by weight of Ag fillers (average particle diameter: 0.2 µm to 3 µm) and 5 parts by weight to 40 parts by weight of photocurable resin (acrylate base) is put on print mask 14 and conductive paste 15 is pressed by squeegee 16. Then, squeegee 16 is allowed to move in the direction of an arrow, thereby filling conductive paste 15 in opening 13.

Figure 2C:
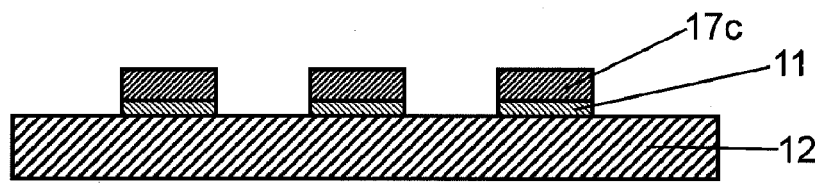
FIG. 2C is a cross-sectional view illustrating a method for forming a conductive bump in accordance with the first exemplary embodiment of the present invention.

Next, as shown in FIG. 2C, print mask 14 is separated from semiconductor wafer 12, thereby printing and forming pre-conductive bump 17c on electrode terminal 11.

Figure 2D:
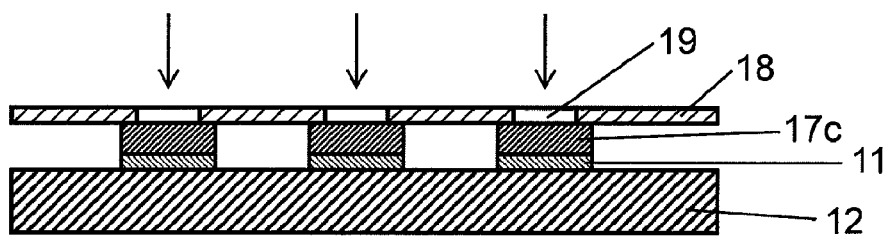
FIG. 2D is a cross-sectional view illustrating a method for forming a conductive bump in accordance with the first exemplary embodiment of the present invention.

Next, as shown in FIG. 2D, exposure mask (hereinafter, referred to as "liquid crystal mask") 18 is disposed and liquid crystal mask 18 is provided with light transmission portion 19 for irradiating necessary sites of pre-conductive bump 17c with light. Then, a photocurable resin constituting conductive paste 15 in pre-conductive bump 17c is irradiated with visible light or ultraviolet light via light transmission portion 19, for example, at 15 mW/mm$^2$ for about five seconds, so as to cure the photocurable resin. Thus, first cured portion 17a is formed.

Since an area and a shape of light transmission portion 19 can be changed freely by a control circuit of liquid crystal mask 18 even during light irradiation, the shape, formation position, and the like of first cured portion 17a can be designed feely.

Figure 2E:
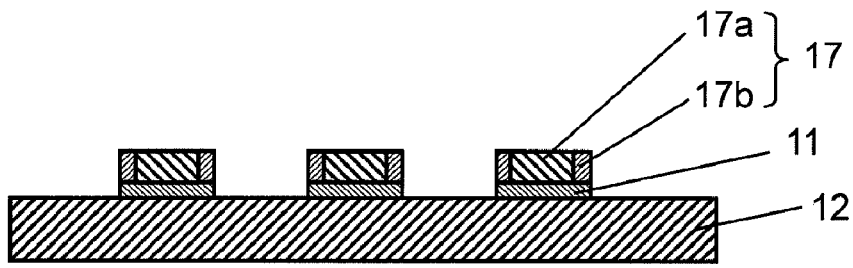
FIG. 2E is a cross-sectional view illustrating a method for forming a conductive bump in accordance with the first exemplary embodiment of the present invention.

Next, as shown in FIG. 2E, for example, by heating at a temperature lower than the thermal curing temperature of the resin components of the conductive paste (for example, about 120° C.), a conductive paste other than first cured portion 17a can be semi-cured and formed in a prepreg state so as to form second cured portion 17b. Thus, conductive bump 17 having first cured portion 17a and second cured portion 17b having different conductive filler densities is formed.

Note here that second cured portion 17b is completely cured by heating when the semiconductor element and the circuit board are flip-chip mounted to each other via conductive bump 17 in the below-mentioned manufacturing step of a semiconductor device. Thus, second cured portion 17b having a conductive filler density larger than that of first cured portion 17a is formed. At this time, the density of the conductive filler of first cured portion 17a is from 10% to 50%, and the density of the conductive filler of second cured portion 17b is from 50% to 90%. The above-mentioned numeric values represent not strictly densities but values calculated from the occupation rate of the conductive filler per unit area in the cross section of the conductive bump.

As mentioned above, the reason why the difference is generated because first cured portion 17a is cured by photo-curing and thermal curing while second cured portion 17b is cured only by thermal curing.

Hereinafter, another example of a configuration of conductive bump 17 in accordance with this exemplary embodiment is described.

Left figures of FIGS. 3A to 3E show perspective views illustrating other examples of conductive bump 17 in accordance with the first exemplary embodiment of the present invention. Right figures of FIGS. 3A to 3E show plan views thereof. FIGS. 3A to 3E do not show electronic components constituting conductive bump 17 and show only the shapes of conductive bump 17 composed of first cured portion 17a and second cured portion 17b formed on electrode terminal 11. Furthermore, the shape of first cured portion 17a shown in FIG. 3 can be freely set to shapes other than the examples shown in FIGS. 3A to 3E by controlling the light transmission portion of a liquid crystal mask.

Figure 3A:
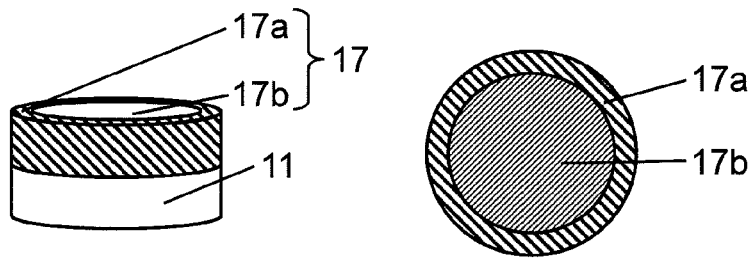
FIG. 3A shows a perspective view and a plan view illustrating another example of a conductive bump in accordance with the first exemplary embodiment of the present invention.

Firstly, FIG. 3A shows a configuration of conductive bump 17 having first cured portion 17a on the periphery thereof and second cured portion 17b in the center portion thereof, which has an opposite configuration to that of the conductive bump in accordance with the first exemplary embodiment. This can be easily formed by a ring-shaped light transmission portion provided in a liquid crystal mask. Thus, for example, it is possible to prevent dripping of the second cured portion, which is generated by heating when the semiconductor element and the circuit board are bonded to each other, by the previously photo-cured first cured portion.

Figure 3B:
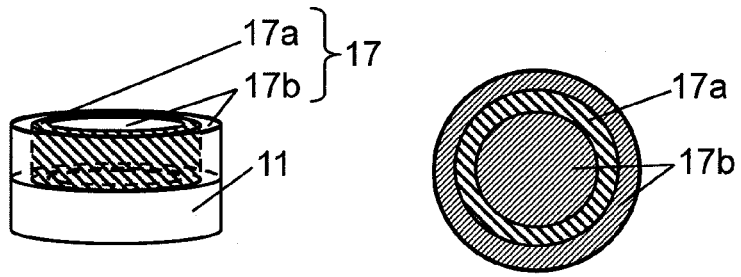
FIG. 3B shows a perspective view and a plan view illustrating a still another example of a conductive bump in accordance with the first exemplary embodiment of the present invention.

Next, FIG. 3B shows conductive bump 17 having first cured portion 17a, which is formed in a ring shape and disposed inside conductive bump 17, and second cured portion 17b, which is disposed in the center of conductive bump 17 and on the outer periphery of first cured portion 17a. In this shape, first cured portion 17a is sandwiched between second cured portions 17b from both sides.

Figure 3C:
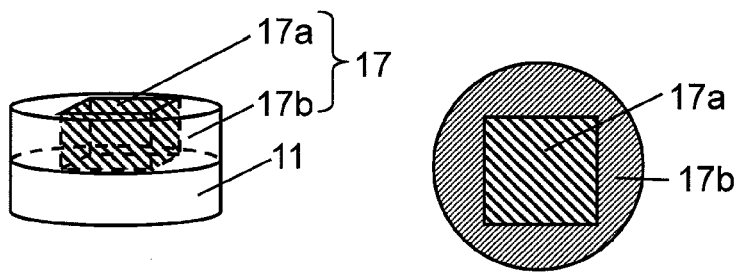
FIG. 3C shows a perspective view and a plan view illustrating a yet another example of a conductive bump in accordance with the first exemplary embodiment of the present invention.

FIGS. 1, 3A and 3B illustrate an example in which first cured portion 17a is formed to have a circular or ring cross-sectional shape, but not limited thereto. For example, as shown in FIG. 3C, first cured portion 17a may be formed in a prism shape in a center position of conductive bump 17 and second cured portion 17b may be provided around first cured portion 17a. FIG. 3C shows first cured portion 17a in a shape of a square prism as an example. However, the shape is not limited thereto and may include pentagonal prism and hexagonal prism whose planar shape is polygon.

Figure 3D:
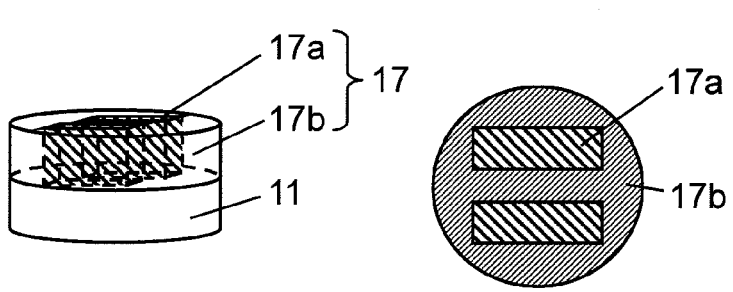
FIG. 3D shows a perspective view and a plan view illustrating a further example of a conductive bump in accordance with the first exemplary embodiment of the present invention.
Figure 3E:
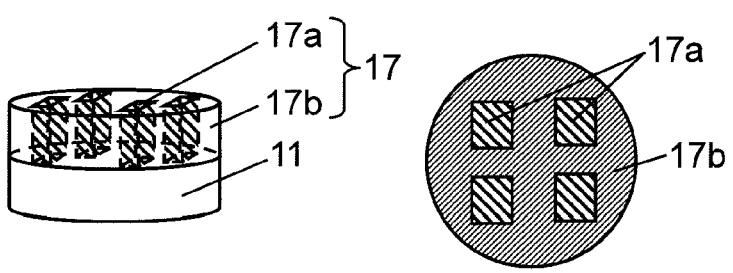
FIG. 3E shows a perspective view and a plan view illustrating a still further example of a conductive bump in accordance with the first exemplary embodiment of the present invention.

Furthermore, FIGS. 3A to 3C illustrate an example in which one first cured portion 17a is formed on electrode terminal 11. However, the configuration is not limited thereto. For example, as shown in FIGS. 3D and 3E, a plurality of first cured portions 17a may be formed on electrode terminal 11. That is to say, FIG. 3D shows an example in which two first cured portions 17a having a rectangular cross-sectional shape are formed on electrode terminal 11, and FIG. 3E shows an example in which four first cured portions 17a are formed. It is needless to say that for first cured portions 17a having a rectangular cross-sectional shape, first cured portions 17a can be formed in a cylindrical shape or other arbitrary shapes. The number of first cured portions 17a may be five or more. Furthermore, in FIG. 3D, for first cured portions 17a having rectangular cross-sectional shape, first cured portions 17a may be formed to have a semicircular cross-sectional shape, respectively. Furthermore, for four first cured portions 17a having square prism shapes as shown in FIG. 3E, for example, four first cured portions 17a having sector cross-sectional shapes can be disposed.

Note here that the shape of first cured portion 17a can be designed suitably by the size or shape of the electrode terminals formed on the upper surface of a semiconductor element or a semiconductor wafer on which conductive bump 17 is formed or pitch between electrode terminals. Furthermore, by considering a load applied at the time of flip-chip mounting and a heating temperature, the conductive filler densities of the first cured portion and the second cured portion can be set arbitrarily by controlling the amount of volatilization of the resin components of the cured resin material when the conductive bump is formed.

Furthermore, the shape and the number of formation of first cured portions 17a are not limited to the above-mentioned examples in accordance with the first exemplary embodiment, and they may be selected arbitrarily as a suitable shape or as a suitable number according to the above-mentioned designing factors.

Furthermore, in this exemplary embodiment, an example in which a circular cross-sectional shaped conductive bump is formed on a circular cross-sectional shaped electrode terminal is described but not limited thereto. For example, electrode terminal 11 may be formed to have a square cross-sectional shape, and conductive bump 17 and first cured portion 17a may be formed according to the shape of electrode terminal 11.

Second Exemplary Embodiment

Hereinafter, a structure of a conductive bump in accordance with a second exemplary embodiment of the present invention is described with reference to FIGS. 4A to 4C.

Figure 4A:
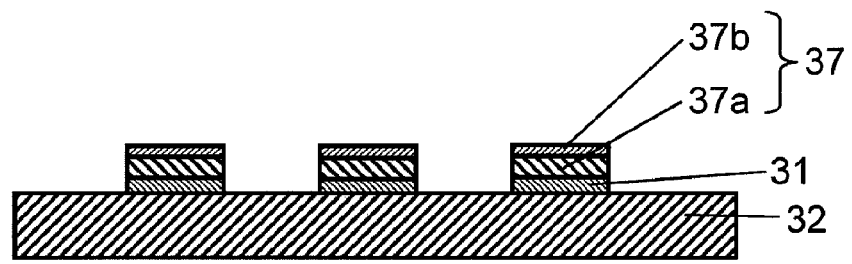
FIG. 4A is a cross-sectional view illustrating a structure of a conductive bump in accordance with a second exemplary embodiment of the present invention.

FIG. 4A is a cross-sectional view illustrating a structure of a conductive bump in accordance with the second exemplary embodiment of the present invention. FIG. 4B is a cross-sectional view illustrating another example of a structure of a conductive bump in accordance with the second exemplary embodiment of the present invention. FIG. 4C is a cross-sectional view illustrating a yet another example of a structure of a conductive bump in accordance with the second exemplary embodiment of the present invention.

Figure 4B:
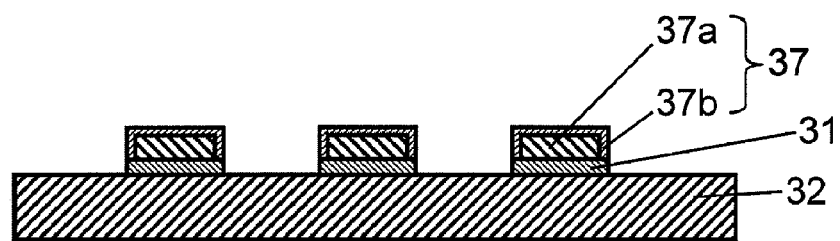
FIG. 4B is a cross-sectional view illustrating another example of a structure of a conductive bump in accordance with the second exemplary embodiment of the present invention.
Figure 4C:
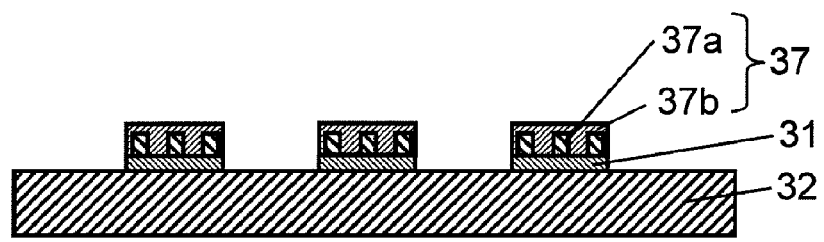
FIG. 4C is a cross-sectional view illustrating a yet another example of a structure of a conductive bump in accordance with the second exemplary embodiment of the present invention.

As shown in FIGS. 4A to 4C, the basic structure includes first cured portion 37a and second cured portion 37b having different densities of conductive filler constituting a conductive bump, which are laminated on, for example, semiconductor wafer 32 in the direction of the thickness (height) of conductive bump 37. Similar to the first exemplary embodiment, an example in which a liquid crystal mask is used as an exposure mask is described. However, a metal mask and the like may be used.

That is to say, first cured portion 37a is formed in the lower part of conductive bump 37 on electrode terminal 31, and second cured portion 37b is formed on the upper part of first cured portion 37a. Also in this exemplary embodiment, first cured portion 37a is formed by irradiation with visible light or ultraviolet light while a light transmission portion of a liquid crystal mask (not shown) is controlled, and then second cured portion 37b is printed so as to cover first cured portion 37a by using a print mask and heated at a low temperature. Thus, a semi-cured second cured portion 37b is formed in a prepreg state.

Specific examples include an example in which first cured portion 37a is formed so as to have the same area and the same shape as those of electrode terminal 31 as shown in FIG. 4A, and an example in which similar to the first exemplary embodiment, first cured portion 37a is formed in the center portion of electrode terminal 31 and then second cured portion 37b is formed around first cured portion 37a as shown in FIG. 4B. Therefore, conductive bump 37 is formed in a state in which first cured portion 37a is embedded in second cured portion 37b.

Furthermore, as shown in FIG. 4C, similar to the case shown in FIGS. 3D and 3E in accordance with the first exemplary embodiment, a plurality of first cured portions 37a may be embedded in second cured portion 37b.

According to this exemplary embodiment, since the entire surface of the semi-cured second cured portion can be bonded to another electrode terminal such as an electronic component, mounting at lower load can be realized. Furthermore, since bonding can be carried out in a semi-cured state, the reliability in bonding can be enhanced.

Third Exemplary Embodiment

Hereinafter, a method for forming a conductive bump in accordance with a third exemplary embodiment of the present invention is described with reference to FIGS. 5A to 5E. FIGS. 5A to 5E are cross-sectional views illustrating a method for forming a conductive bump in accordance with the third exemplary embodiment of the present invention. Similar to the case in the first exemplary embodiment, an example in which a semiconductor wafer having a large number of semiconductor elements as an electronic component to be provided with a conductive bump is formed described. Furthermore, an example in which a liquid crystal mask is used as an exposure mask is described. However, a metal mask may be used.

Figure 5A:
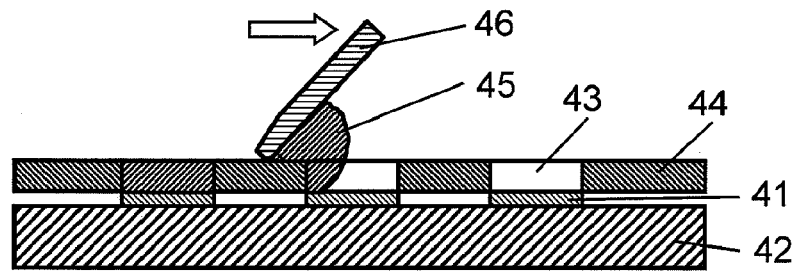
FIG. 5A is a cross-sectional view illustrating a method for forming a conductive bump in accordance with a third exemplary embodiment of the present invention.
Figure 5B:
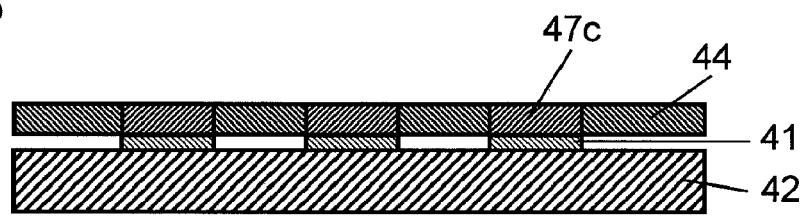
FIG. 5B is a cross-sectional view illustrating a method for forming a conductive bump in accordance with the third exemplary embodiment of the present invention.

Firstly, as shown in FIG. 5A, on the upper surface of semiconductor wafer 42 having a plurality of semiconductor elements on which a plurality of electrode terminals 41 are formed, print mask 44 having openings 43 for forming conductive bumps corresponding to the positions of electrode terminals 41 is disposed. Next, conductive paste 45 is put on print mask 44 and pressed by squeegee 46. Then, squeegee 46 is allowed to move in the direction of an arrow, thereby filling conductive paste 45 in opening 43. Thus, as shown in FIG. 5B, pre-conductive bump 47c is formed.

Figure 5C:
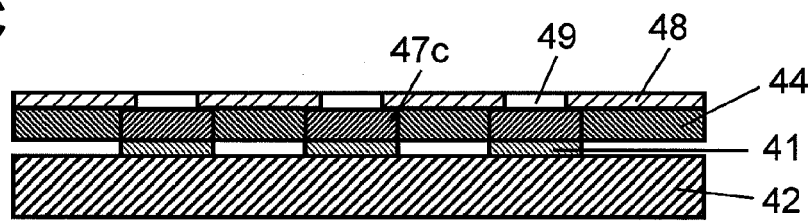
FIG. 5C is a cross-sectional view illustrating a method for forming a conductive bump in accordance with the third exemplary embodiment of the present invention.

Next, as shown in FIG. 5C, liquid crystal mask 48 having light transmission portion 49 is disposed on the upper surface of print mask 44.

Figure 5D:
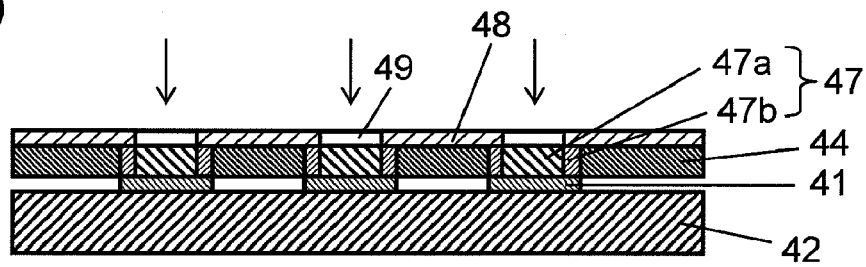
FIG. 5D is a cross-sectional view illustrating a method for forming a conductive bump in accordance with the third exemplary embodiment of the present invention.

At this time, liquid crystal mask 48 is disposed so that light transmission portion 49 is positioned to sites that needs to be irradiated with light in pre-conductive bump 47c. Then, as shown in FIG. 5D, a photocurable resin constituting conductive paste 45 in pre-conductive bump 47c is irradiated with visible light or ultraviolet light via light transmission portion 49 so as to cure the photocurable resin. Thus, first cured portion 47a is formed.

Note here that similar to the first exemplary embodiment, an area and a shape of light transmission portion 49 can be changed freely by a control circuit of liquid crystal mask 48, and a shape and a formation position, and the like, of first cured portion 47a may be controlled feely similar to the case shown in FIGS. 3A to 3E.

Figure 5E:
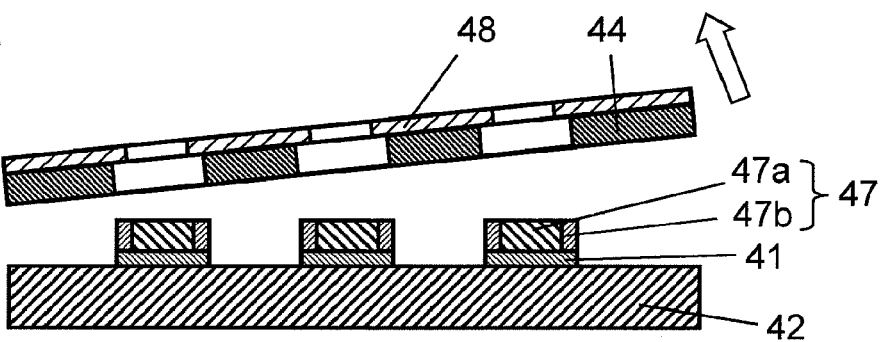
FIG. 5E is a cross-sectional view illustrating a method for forming a conductive bump in accordance with the third exemplary embodiment of the present invention.

Next, as shown in FIG. 5E, for example, by heating at a temperature lower than the thermal curing temperature of resin components of the conductive paste (for example, about 120° C.), a conductive paste other than first cured portion 47a is semi-cured and formed in a prepreg state so as to form second cured portion 47b. Thereafter, print mask 44 and liquid crystal mask 48 are removed from semiconductor wafer 42 sequentially or simultaneously in the direction shown by an arrow.

Thus, conductive bump 47 composed of first cured portion 47a and second cured portion 47b having a larger conductive filler density than that of first cured portion 47a is formed on electrode terminal 41 of semiconductor wafer.

According to this exemplary embodiment, when the second cured portion is heated, it is cured in a state in which the periphery thereof is surrounded by the print mask. Therefore, it is possible to prevent the conductive paste of the second cured portion from dripping. Furthermore, since a print mask or a liquid crystal mask is removed in a state in which the second cured portion is in a semi-cured state, the deformation of the conductive bump, which is caused when the conductive paste is dragged by a print mask, and the like, does not easily occur.

Fourth Exemplary Embodiment

Figure 6A:
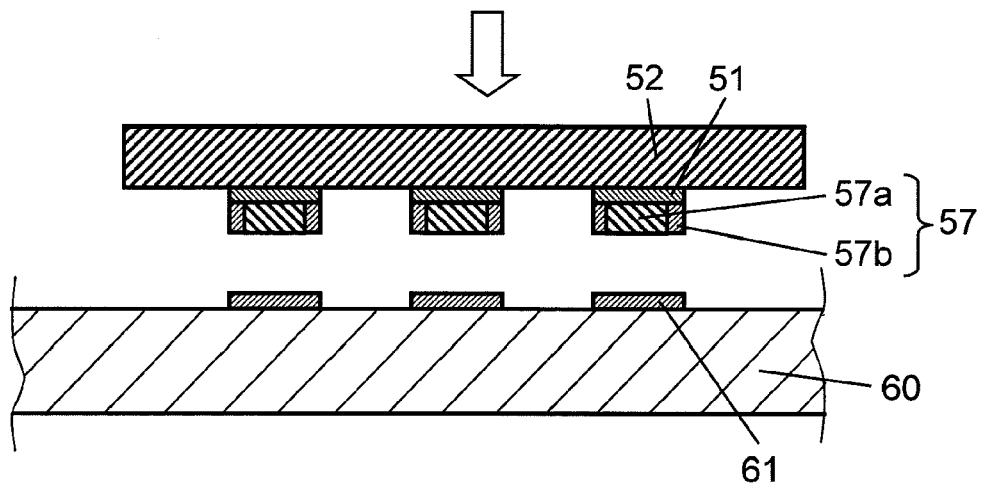
FIG. 6A is a cross-sectional view illustrating a method for manufacturing a semiconductor device in accordance with a fourth exemplary embodiment of the present invention.
Figure 6B:
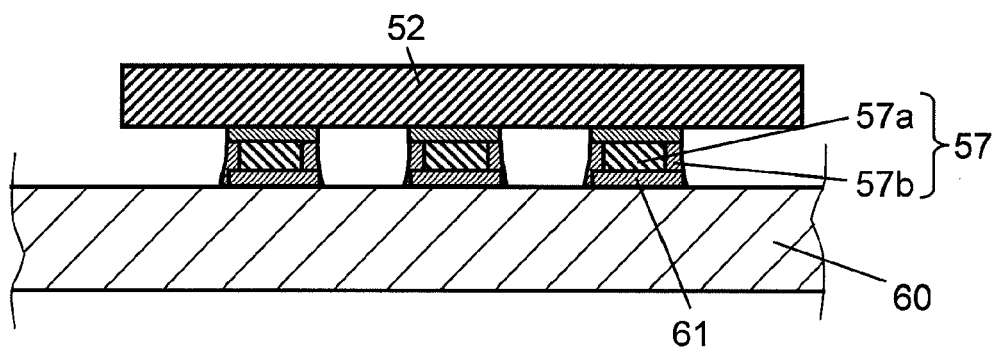
FIG. 6B is a cross-sectional view illustrating a method for manufacturing a semiconductor device in accordance with the fourth exemplary embodiment of the present invention.
Figure 6C:
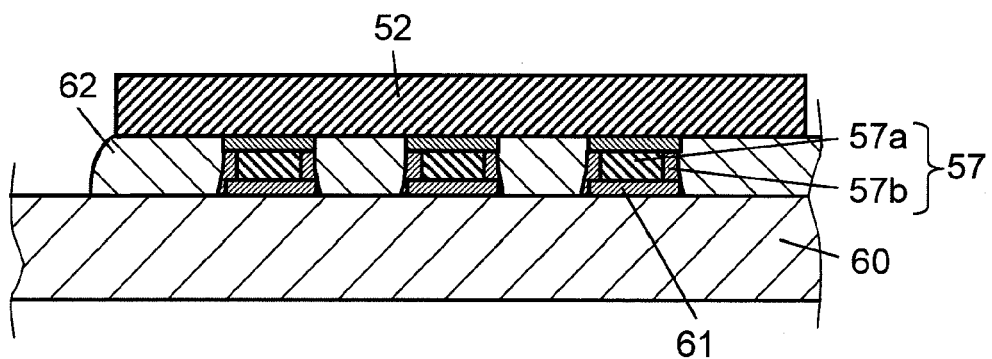
FIG. 6C is a cross-sectional view illustrating a method for manufacturing a semiconductor device in accordance with the fourth exemplary embodiment of the present invention.
Figure 7A:
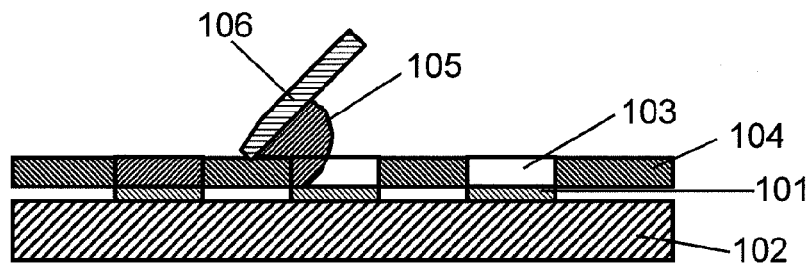
FIG. 7A is a cross-sectional view showing a method for forming a conventional conductive bump using conductive paste.
Figure 7B:
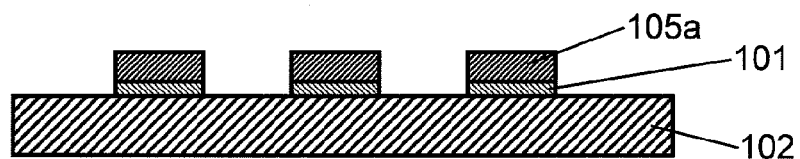
FIG. 7B is a cross-sectional view showing a method for forming a conventional conductive bump using conductive paste.
Figure 7C:
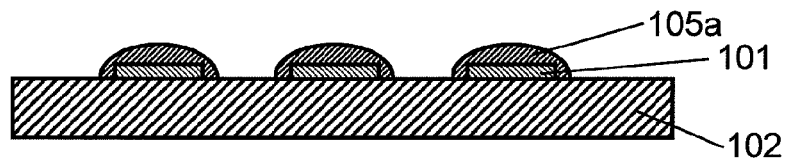
FIG. 7C is a cross-sectional view showing a method for forming a conventional conductive bump using conductive paste.
Figure 7D:
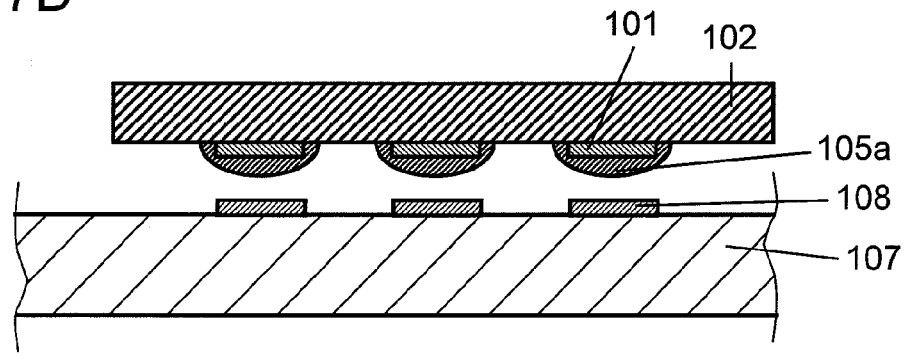
FIG. 7D is a cross-sectional view showing a method for forming a conventional conductive bump using conductive paste.
Figure 7E:
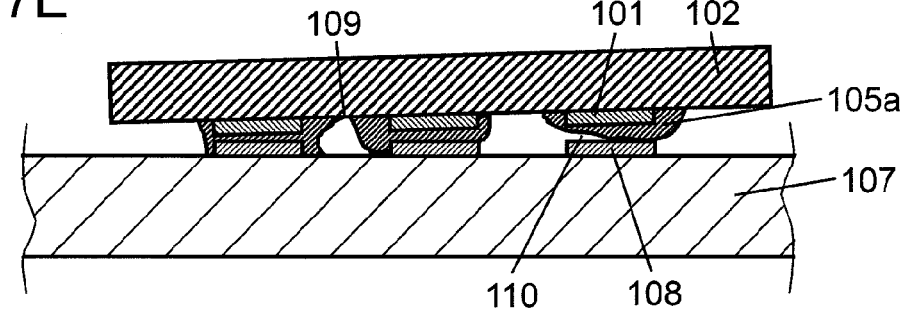
FIG. 7E is a cross-sectional view showing a method for forming a conventional conductive bump using conductive paste.

Hereinafter, a method for manufacturing a semiconductor device in accordance with a fourth exemplary embodiment of the present invention is described with reference to FIGS. 6A to 6C. FIGS. 6A to 6C are cross-sectional views illustrating a method for manufacturing a semiconductor device in accordance with the fourth exemplary embodiment of the present invention. The semiconductor device has a configuration in which a semiconductor element having the conductive bump formed in the above-mentioned exemplary embodiments is flip-chip mounted on the circuit board.

Firstly, as a pre-step, a semiconductor wafer on which the conductive bump shown in each of the above-mentioned exemplary embodiments is formed is cut by using a dicing saw, and divided into a large number of semiconductor elements 52 capable of being flip-chip mounted on the circuit board 60.

Next, as shown in FIG. 6A, a surface of electrode terminal 51 of semiconductor element 52 on which conductive bumps 57 each composed of first cured portion 57a and second cured portion 57b are formed is disposed facing electrode terminal 61 on circuit board 60 and pressurized in the direction of an arrow.

Next, as shown in FIG. 6B, the interval between semiconductor element 52 and circuit board 60 is held while it is restricted by first cured portion 57a cured by a photo-curing method. Then, at the same time, by heating at, for example, about 150° C., a prepreg state second cured portion 57b of conductive bump 57 is completely cured. Thus, circuit board 60 and semiconductor element 52 are bonded to each other electrically and mechanically.

Next, as shown in FIG. 6C, insulating sealing resin 62 is filled in a gap between semiconductor element 52 and circuit board 60, followed by heating and curing. Thus, a semiconductor device is produced.

According to this exemplary embodiment, even if a pressure applied to semiconductor element 52 is partly changed, since the interval between semiconductor element 52 and circuit board 60 can be restricted by first cured portion 57a constituting conductive bump 57, semiconductor element 52 can be mounted without being tilted. Thus, it is possible to prevent the occurrence of a short circuit or a connection failure between electrode terminals due to non-uniform crush or overflow of the conductive bump by change in a gap, which has been a problem in a conventional flip-chip mounting method. Furthermore, since non-uniform crush in the conductive bump does not easily occur, conductive bumps can be formed with a narrow pitch, and a semiconductor device can be mounted with a high density. Furthermore, due to semi-cured second cured portion 57b of conductive bump 57, it is possible to prevent the displacement between the semiconductor element and the electrode terminal of the circuit board in the mounting step.

As described above, with a conductive bump made of cured resin material composed of at least a first cured portion and a second cured portion having different conductive filler densities, it is possible to suppress crush of a conductive bump at the time of flip mounting and to realize a semiconductor device that is excellent in reliability.

INDUSTRIAL APPLICABILITY

According to the present invention, since a non-uniform crush of a conductive bump by pressure at the time of mounting can be prevented, a short circuit or a connection failure between electrode terminals do not tend to occur. Therefore, the present invention is useful in the field of mounting in which high density mounting with a narrow pitch is demanded, in semiconductor devices, and the like.

The invention claimed is:

1. A conductive bump formed on a surface of an electrode terminal of an electronic component,
wherein the conductive bump is composed of at least a plurality of cured resin materials having different conductive filler densities.

2. The conductive bump of claim 1,
wherein the electronic component is a semiconductor element or a circuit board.

3. The conductive bump of claim 1,
wherein the conductive filler density of the cured resin material formed at least in a center portion is smaller than the conductive filler density of the cured resin material formed in a peripheral portion in the conductive bump.

4. The conductive bump of claim 1,
wherein the conductive filler density of the cured resin material formed at least in a center portion is larger than the conductive filler density of the cured resin material formed in a peripheral portion in the conductive bump.

5. The conductive bump of claim 1,
wherein the plurality of cured resin materials containing the conductive filler include at least a first cured portion cured by a photo-curing method and a thermal curing method, and a second cured portion cured by the thermal curing method.

6. The conductive bump of claim 1,
wherein a resin component of the cured resin material of the conductive bump includes at least a photocurable resin component and a thermosetting resin component.

7. A method for forming a conductive bump, the method comprising:
positioning an opening of a print mask to an electrode terminal of an electronic component, and coating a conductive paste on the electrode terminal via the opening;
removing the print mask, and then irradiating a part of a conductive paste on the electrode terminal with ultraviolet light or visible light via an exposure mask, so that a part of the conductive paste is cured so as to form a first cured portion; and
heating the electronic component so as to form a second cured portion in a portion other than the first cured portion.

8. A method for forming a conductive bump, the method comprising:
positioning an opening of a print mask to an electrode terminal of an electronic component, and printing a conductive paste on the electrode terminal via the opening;
disposing an exposure mask on an upper surface of the print mask, and irradiating a part of the printed conductive paste with ultraviolet light or visible light via the exposure mask, so that a part of the conductive paste is cured so as to form a first cured portion;
heating the electronic component so as to form a second cured portion in a portion other than the first cured portion, and
removing the exposure mask and the print mask.

9. The method for forming a conductive bump of claim 7, wherein the exposure mask is a liquid crystal mask.

10. The method for forming a conductive bump of claim 7, wherein the conductive paste includes a photocurable resin and a thermosetting resin.

11. A semiconductor device comprising a conductive bump of claim 1, wherein an electrode terminal of a circuit board and an electrode terminal of a semiconductor element are electrically connected to each other with the conductive bump.

12. A method for manufacturing a semiconductor device, the method comprising:
cutting a semiconductor wafer on which a conductive bump is formed by any one of the methods for forming a conductive bump described in claim 7 into individual semiconductor elements;
reversing the semiconductor element, positioning and mounting the conductive bump on an electrode terminal of a circuit board;
pressurizing and heating the semiconductor element and the circuit board, thereby curing at least a second cured portion of the conductive bump to bond the semiconductor element and the circuit board to each other; and
filling a sealing resin into a gap between the semiconductor element and the circuit board and curing thereof.

13. The method for forming a conductive bump of claim 8, wherein the exposure mask is a liquid crystal mask.

14. The method for forming a conductive bump of claim 8, wherein the conductive paste includes a photocurable resin and a thermosetting resin.

15. A method for manufacturing a semiconductor device, the method comprising:
cutting a semiconductor wafer on which a conductive bump is formed by any one of the methods for forming a conductive bump described in claim 8 into individual semiconductor elements;
reversing the semiconductor element, positioning and mounting the conductive bump on an electrode terminal of a circuit board;
pressurizing and heating the semiconductor element and the circuit board, thereby curing at least a second cured portion of the conductive bump to bond the semiconductor element and the circuit board to each other; and
filling a sealing resin into a gap between the semiconductor element and the circuit board and curing thereof.

* * * * *